US009055659B2

(12) United States Patent
Hitomi et al.

(10) Patent No.: US 9,055,659 B2
(45) Date of Patent: Jun. 9, 2015

(54) METHOD FOR MANUFACTURING OUTER CONDUCTOR

(75) Inventors: Haruki Hitomi, Tokyo (JP); Katsuya Sennyu, Tokyo (JP); Hiroshi Hara, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 241 days.

(21) Appl. No.: 13/635,763

(22) PCT Filed: Mar. 24, 2011

(86) PCT No.: PCT/JP2011/057124
§ 371 (c)(1), (2), (4) Date: Sep. 18, 2012

(87) PCT Pub. No.: WO2011/125511
PCT Pub. Date: Oct. 13, 2011

(65) Prior Publication Data
US 2013/0008021 A1 Jan. 10, 2013

(30) Foreign Application Priority Data
Apr. 9, 2010 (JP) ................................ 2010-090321

(51) Int. Cl.
*H01L 39/24* (2006.01)
*H05H 7/02* (2006.01)
(Continued)

(52) U.S. Cl.
CPC ............. *H05H 7/02* (2013.01); *Y10T 29/49117* (2015.01); *B21D 51/16* (2013.01); *H05H 7/22* (2013.01); *H05H 7/20* (2013.01); *H05H 2007/227* (2013.01); *B21D 22/20* (2013.01)

(58) Field of Classification Search
USPC .................. 29/599, 825, 835, 844, 854, 876, 29/893.34, 894.353; 315/5.41, 5.46, 500, 315/501, 505, 506; 333/195, 115, 206, 227, 333/230–233, 239, 252, 99 S
See application file for complete search history.

(56) References Cited

U.S. PATENT DOCUMENTS 3,650,017 A * 3/1972 Gal ............................. 29/527.4
4,550,004 A * 10/1985 Mizuno ......................... 264/645
(Continued)

FOREIGN PATENT DOCUMENTS

JP 62-9086 1/1987
JP 1-231300 9/1989
(Continued)

OTHER PUBLICATIONS

Decision to Grant a Patent issued Jan. 28, 2014 in corresponding Japanese Application No. 2010-090321, with English translation.
(Continued)

*Primary Examiner* — Paul D Kim
(74) *Attorney, Agent, or Firm* — Wenderoth, Lind & Ponack, L.L.P.

(57) ABSTRACT

A method for manufacturing an outer conductor of a higher-order-mode coupler for a superconducting acceleration cavity. The outer conductor includes a cylindrical main body that is open at one end surface thereof, a port formed in a side of the main body so as to penetrate therethrough, and a protruding part formed outside another end surface of the main body. The method includes a deep drawing step of deep-drawing a metal plate to form the main body, a port-forming step of flanging the thus-formed main body to form the port, and a first machining step of machining the main body to adjust an outer shape thereof.

3 Claims, 6 Drawing Sheets

(51) Int. Cl.

| | |
|---|---|
| ***B21D 51/16*** | (2006.01) |
| ***H05H 7/22*** | (2006.01) |
| ***H05H 7/20*** | (2006.01) |
| ***B21D 22/20*** | (2006.01) |

(56) References Cited

U.S. PATENT DOCUMENTS

| | | | | |
|---|---|---|---|---|
| 5,878,494 | A * | 3/1999 | Hamaekers | 29/896.93 |
| 5,933,936 | A * | 8/1999 | Wand | 29/283 |
| 7,225,658 | B2 * | 6/2007 | Hakansson et al. | 72/267 |
| 2006/0112751 | A1 * | 6/2006 | Hakansson et al. | 72/267 |
| 2012/0094839 | A1 * | 4/2012 | Khare et al. | 505/210 |

FOREIGN PATENT DOCUMENTS

| | | |
|---|---|---|
| JP | 4-221000 | 8/1992 |
| JP | 8-138893 | 5/1996 |
| JP | 10-50499 | 2/1998 |
| JP | 11-16699 | 1/1999 |
| JP | 11-102800 | 4/1999 |
| JP | 2003-37000 | 2/2003 |
| JP | 2010-40423 | 2/2010 |
| WO | 2004/009267 | 1/2004 |

OTHER PUBLICATIONS

International Search Report issued May 17, 2011 in corresponding International Application No. PCT/JP2011/057124.

Written Opinion of the International Searching Authority issued May 17, 2011 in corresponding International Application No. PCT/JP2011/057124.

Office Action issued Dec. 4, 2012 in corresponding Japanese Application No. 2010-090321 (with partial English translation).

Extended European Search Report issued Feb. 16, 2015 in corresponding European patent application No. 11 765 412.9-1551.

K. Sennyu et al., "SRF Activities for ILC At MHI", May 6, 2009, XP055167186, Retrieved from the Internet: URL:http://accelconf.web.cern.ch/AccelConf/PAC2009/papers/we5pfp040.pdf [retrieved on Feb. 4, 2015], p. 2084.

K. Sennyu et al., "SRF Activities for ILC At MHI", Proceedings of the 23rd Particle Accelerator Conference, Dec. 1, 2010, XP055167165, p. 2084.

K. Sennyu et al., "Status of the Superconducting Cavity Development for ILC At MHI", Proceedings of the 23rd Particle Accelerator Conference, Jul. 1, 2008, XP055167222, p. 464.

* cited by examiner

METHOD FOR MANUFACTURING OUTER CONDUCTOR

BACKGROUND OF THE INVENTION

1. Technical Field

The present invention relates to methods for manufacturing outer conductors of higher-order-mode couplers for superconducting acceleration cavities.

2. Description of the Related Art

Superconducting acceleration cavities accelerate charged particles passing therethrough. One way for a superconducting acceleration cavity to deliver predetermined performance is to attach higher-order-mode (HOM) couplers to beam pipes at the ends thereof to remove higher-order modes, which hinder beam acceleration, in other words, to extract higher-order modes induced in the superconducting acceleration cavity outside the superconducting acceleration cavity (Japanese Unexamined Patent Application, Publication No. HEI-10-50499).

A higher-order-mode coupler is composed of an inner conductor, an outer conductor, and a pickup port. The outer conductor is fabricated from a superconducting material such as niobium and is formed in a cylindrical shape that is open at one end surface thereof such that the opening is joined to a beam pipe. The side of the outer conductor has a port that allows a member for extracting higher-order modes to the outside to pass therethrough. An end surface of the outer conductor is thin and has a protruding part. The outer conductor can be deformed by externally holding the protruding part and pushing or pulling it to finely adjust the spacing between the outer conductor and the inner conductor, thereby finely adjusting the wavelength of the higher-order modes to be extracted.

SUMMARY OF THE INVENTION

1. Technical Problem

Related-art outer conductors, for example, are cut from niobium blocks and are processed to the dimensions of the final product by machining. This involves a large number of machining steps because of the considerable amount of processing of inner surfaces, which are difficult to machine, and also wastes a large amount of material, thus causing problems such as extended manufacturing time and high manufacturing costs.

In light of these circumstances, an object of the present invention is to provide a method for manufacturing an outer conductor of a higher-order-mode coupler in a low-cost, material-saving manner.

2. Solution to the Problem

To solve the above problems, the present invention employs the following solutions.

Specifically, an aspect of the present invention is a method for manufacturing an outer conductor of a higher-order-mode coupler for a superconducting acceleration cavity, the outer conductor including a cylindrical main body that is open at one end surface thereof, a port formed in a side of the main body so as to penetrate therethrough, and a protruding part formed outside another end surface of the main body, and the method includes a deep drawing step of deep-drawing a metal plate to form the main body, a port-forming step of flanging the thus-formed main body to form the port, and a first machining step of machining the main body to adjust the outer shape thereof.

In the method for manufacturing the outer conductor according to the aspect of the present invention, a metal plate of predetermined shape is deep-drawn in the deep drawing step to form the main body. The main body thus formed is flanged to form the port and is then machined to adjust the outer shape thereof.

As above, because the metal plate is deep-drawn to form the main body, the amount of processing of the inner surface of the main body, which is difficult to process, can be considerably reduced, and the amount of material removed can be significantly reduced. This allows an outer conductor of a higher-order-mode coupler to be manufactured in a low-cost, material-saving manner.

The metal plate used to perform deep drawing in the deep drawing step may be thicker than the finished thickness of the cylindrical portion of the main body, and the method may further include, before the port-forming step, a second machining step of machining the main body to the finished thickness of the cylindrical portion of the main body.

As above, because the deep drawing is followed by machining the main body to the finished thickness of the cylindrical portion, the precision of the deep drawing can be lowered.

In this case, the metal plate preferably has a thickness sufficient to form the protruding part between that thickness and the finished thickness.

The metal plate used in the deep drawing step preferably has such a thickness that the finished thickness of the cylindrical portion of the main body is achieved after the processing.

As above, because the main body formed by deep drawing in the deep drawing step has the finished thickness of the cylindrical portion, the port-forming step can be initiated immediately. In particular, the processing of the inner surface of the main body, which is difficult to process, can be completely eliminated.

If the inner diameter and height of the cylindrical portion are several tens of millimeters, the thickness of the metal plate is the same as the finished thickness of the cylindrical portion.

In the above aspect, a portion of the protruding part may be separately formed so as to be joined after the first machining step.

If the height of a portion of the protruding part on the end surface, for example, a portion, protruding from an inner wall, of the protruding part formed so as to protrude, is larger than the thickness of the metal plate, the larger portion may be separately formed and joined.

3. Advantageous Effects of the Invention

Because the metal plate is deep-drawn to form the main body in the present invention, an outer conductor of a higher-order-mode coupler can be manufactured in a low-cost, material-saving manner.

DETAILED DESCRIPTION OF THE INVENTION

Embodiments of the present invention will now be described in detail using the attached drawings.

First Embodiment

A method for manufacturing an outer conductor according to a first embodiment of the present invention will now be described with reference to FIGS. 1 to 9.

Figure 1:
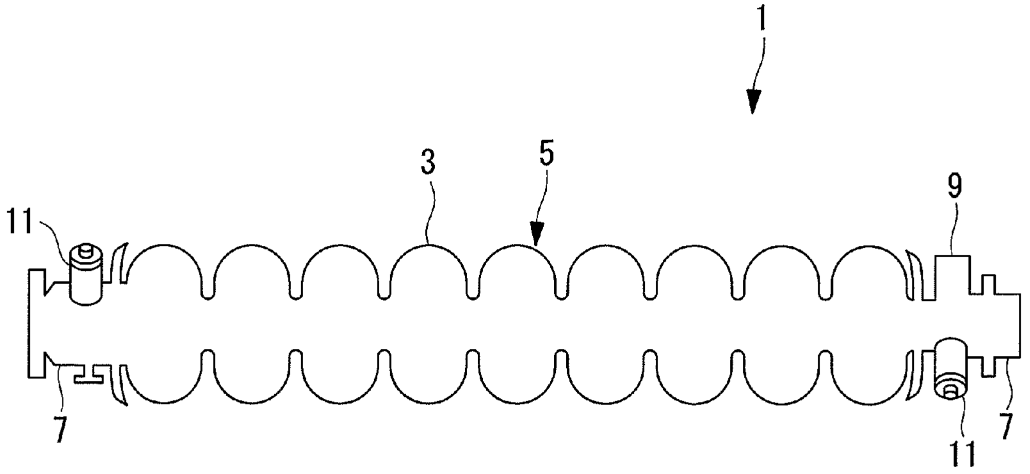
FIG. 1 is a front view of a superconducting acceleration cavity equipped with higher-order-mode couplers manufactured by a method for manufacturing an outer conductor according to a first embodiment of the present invention.
Figure 2:
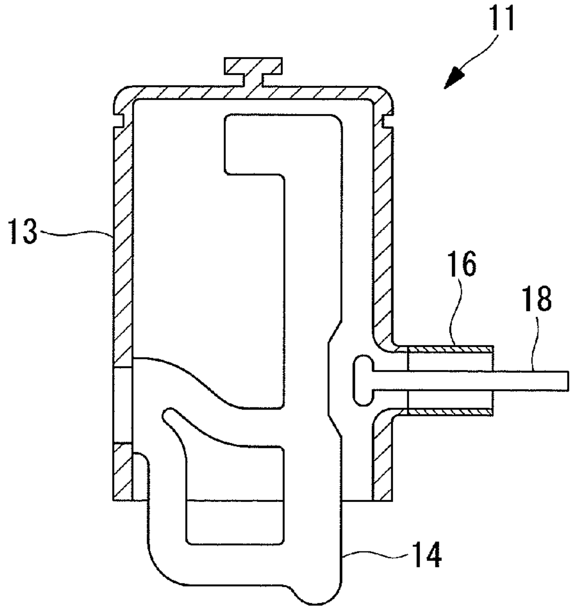
FIG. 2 is a sectional view schematically illustrating the structure of the higher-order-mode couplers in FIG. 1.
Figure 3:
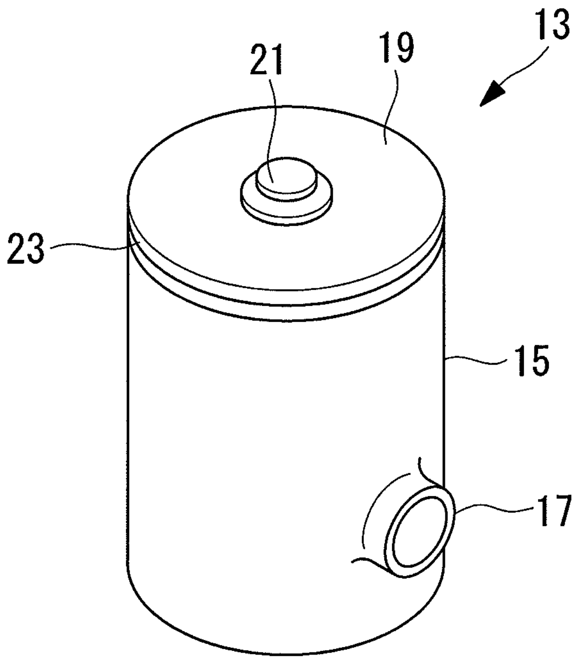
FIG. 3 is a perspective view illustrating an outer conductor of the higher-order-mode coupler in FIG. 2.

FIG. 1 is a front view of a superconducting acceleration cavity equipped with higher-order-mode couplers manufactured by the method for manufacturing an outer conductor according to the first embodiment of the present invention. FIG. 2 is a sectional view schematically illustrating the structure of the higher-order-mode couplers in FIG. 1. FIG. 3 is a perspective view illustrating an outer conductor of the higher-order-mode coupler in FIG. 2.

Referring to FIG. 1, a superconducting acceleration cavity 1 includes a cavity body 5 assembled by joining together, for example, nine cylindrical cells 3 that bulge in the center thereof by means of welding and beam pipes 7 attached to both ends of the cavity body 5.

One of the beam pipes 7 has an input port 9 to which an input coupler for inputting microwaves into the cavity body 5 is attached and a higher-order-mode coupler 11 for releasing higher-order modes excited in the cavity body 5, which hinder beam acceleration, outside the cavity body 5. Another higher-order-mode coupler 11 is attached to the other beam pipe 7.

The cells 3, the beam pipes 7, the input port 9, and the higher-order-mode couplers 11 are formed of a superconducting material such as niobium.

Referring to FIG. 2, the higher-order-mode coupler 11 includes an outer conductor 13, an inner conductor 14, and a pickup port 16 through which a pickup antenna 18 passes.

Referring to FIG. 3, the outer conductor 13 includes a main body 15 formed in a cylindrical shape that is open at one end surface thereof (the lower surface in FIG. 3) such that the opening is joined to the beam pipe 7; a port 17 formed in the side of the main body 15 so as to penetrate therethrough; a mounting portion 20 formed in the side of the main body 15 so as to penetrate therethrough and to which the inner conductor 14 is joined; and a protruding part 21 formed on an end surface 19 of the main body 15 so as to protrude therefrom.

The end surface 19 of the main body 15 is thinner than the side surface (cylindrical portion) thereof. A groove 23 is formed near the end surface 19 on the side surface of the main body 15, over the circumference thereof. These allow the end surface 19 of the main body 15 to be relatively easily deformed.

The port 17 is formed so as to protrude outward from the main body 15. The port 17 has a pipe shape of substantially circular cross-section and has a joining surface to which the pickup port 16 is coupled at the end thereof.

The pickup antenna 18 is inserted into the cylindrical space formed by the pickup port 16 and the port 17 to extract higher-order modes to the outside.

Figure 4:
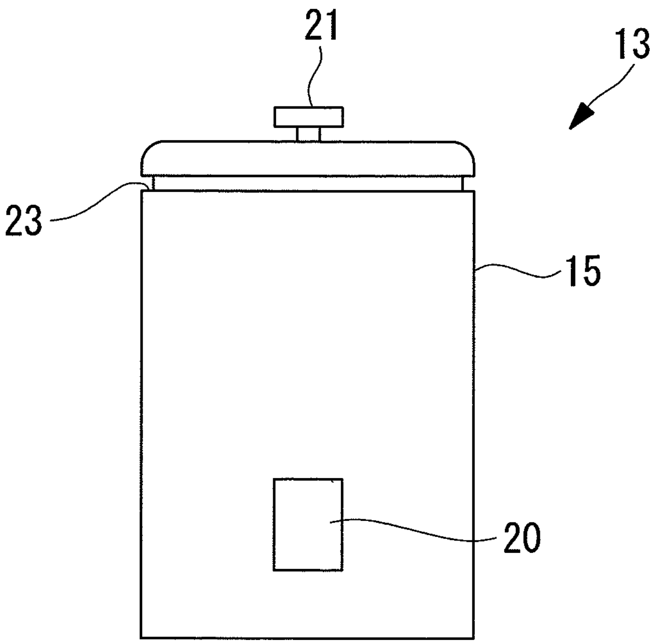
FIG. 4 is a back view of the outer conductor of the higher-order-mode coupler in FIG. 3.
Figure 5:
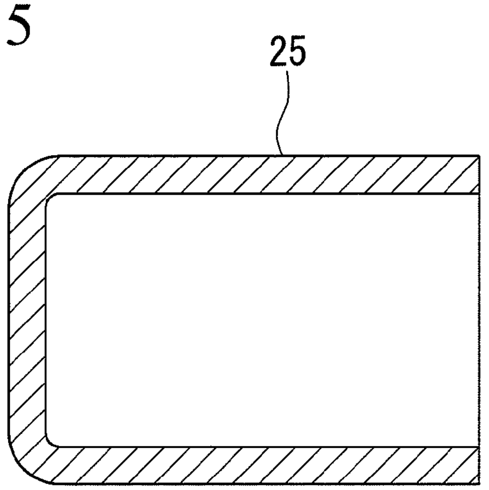
FIG. 5 is a sectional view illustrating the state after deep drawing in the method for manufacturing an outer conductor according to the first embodiment of the present invention.

Referring to FIG. 4, the mounting portion 20 is cut in a rectangular shape in the main body 15 at a position substantially opposite the port 17 of the main body 15.

The protruding part 21 has a groove in the middle thereof in the height direction. The protruding part 21 can be externally held at the groove by a holding member (not shown) and can be pushed and pulled to deform the end surface 19, thereby adjusting the spacing between the outer conductor 13 and the inner conductor 14 disposed in the main body 15.

A method for manufacturing the outer conductor 13 will now be described based on FIGS. 5 to 9. As the approximate dimensions of the manufactured outer conductor 13, for example, the inner diameter of the main body 15 is 42 mm, the outer diameter thereof is 48 mm, the height thereof is 70 mm, the thickness of the end surface 19 is 1.5 mm, and the height of the protruding part 21 is 4 mm.

A niobium disc (metal plate) having a thickness of 6 mm and an outer diameter of 125 mm is prepared. This disc is deep-drawn into a first rough shape 25 illustrated in FIG. 5 (deep drawing step). As the approximate dimensions of the first rough shape 25, for example, the inner diameter is 41.5 mm, the outer diameter is 53.5 mm, the height is 70 mm, and the thickness is 6 mm.

Figure 6:
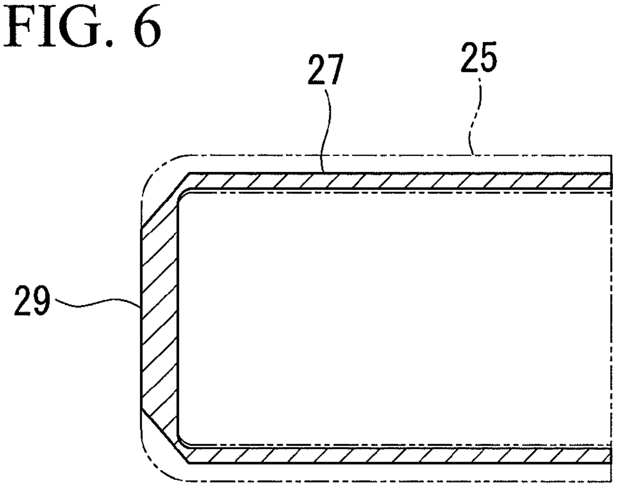
FIG. 6 is a sectional view illustrating the state after machining for adjusting inner and outer diameters in the method for manufacturing an outer conductor according to the first embodiment of the present invention.

The first rough shape 25 is then machined into a second rough shape 27 illustrated in FIG. 6 such that the inner and outer diameters, excluding a portion 29 to be processed into the protruding part 21, are the dimensions of the final product, namely, 42 mm and 48 mm, respectively (second machining step). In this step, the portion 29 to be processed into the end surface 19 is cut from inside to a thickness sufficient to ensure the thickness of the end surface 19, namely, 1.5 mm, and the height of the protruding part 21, namely, 4 mm.

As above, because the deep drawing is followed by machining such that the side surface of the main body 15 has the finished thickness, the finished thickness can be reliably achieved by dimensional adjustment after low-precision deep drawing.

The second rough shape 27 is flanged to form the port 17 (port-forming step). The flanging step is performed by, for example, a combination of bulging and burring.

The second rough shape 27 is attached to a die having a cavity to which the second rough shape 27 is attached and a cavity corresponding to the port 17.

Figure 7:
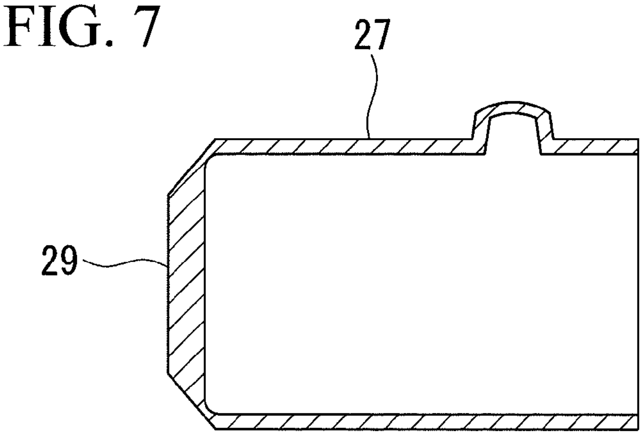
FIG. 7 is a sectional view illustrating the state after bulging in a flanging step of the method for manufacturing an outer conductor according to the first embodiment of the present invention.

Bulging is performed first by introducing a fluid pressurizing medium into the inner space of the second rough shape 27 and pressurizing the pressurizing medium. As the pressurizing medium is pressurized, a portion of the second rough shape 27 is expanded into the cavity corresponding to the port 17, as illustrated in FIG. 7.

Figure 8:
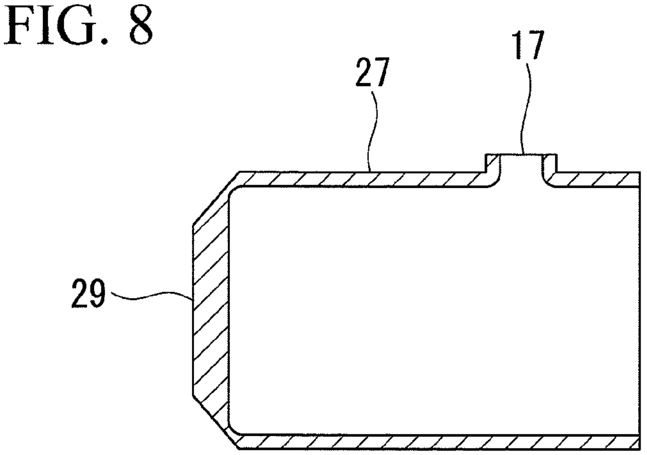
FIG. 8 is a sectional view illustrating the state after burring in the flanging step of the method for manufacturing an outer conductor according to the first embodiment of the present invention.

Burring is then performed by pressing a tool against the portion of the second rough shape 27 that has expanded from the inner space thereof by bulging, thus forming the port 17, as illustrated in FIG. 8.

In this way, the port 17 is formed.

Figure 9:
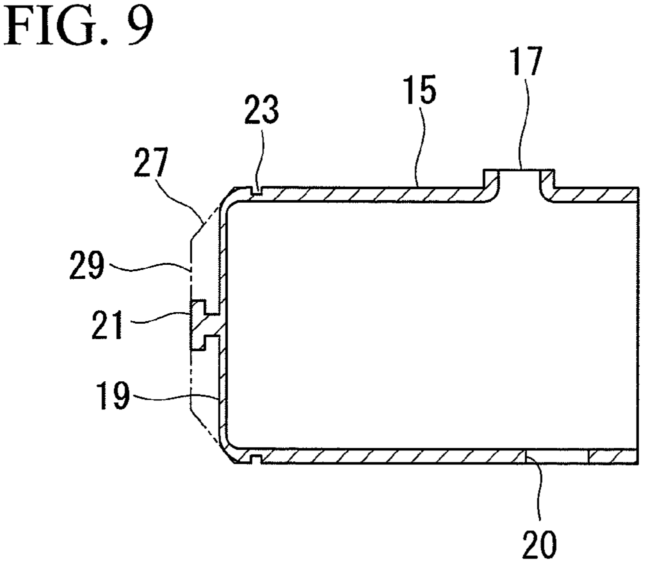
FIG. 9 is a sectional view illustrating the state after final machining in the method for manufacturing an outer conductor according to the first embodiment of the present invention.
Figure 10:
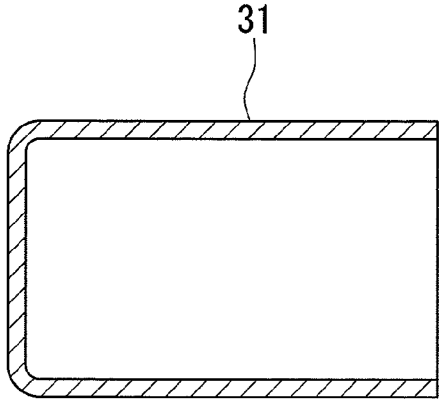
FIG. 10 is a sectional view illustrating the state after deep drawing in a method for manufacturing an outer conductor according to a second embodiment of the present invention.

Turning to FIG. 9, the end surface 19, the mounting portion 20, the protruding part 21, and the groove 23 are formed on the second rough shape 27 by machining (first machining step).

As above, because the portion 29 of the second rough shape 27 has a thickness sufficient to ensure the thickness of the end surface 19, namely, 1.5 mm, and the height of the protruding part 21, namely, 4 mm, the end surface 19 and the protruding part 21 can be integrally formed.

As above, because a niobium disc is deep-drawn to form the main body 15, the amount of processing of the inner surface of the main body 15, which is difficult to process, can be considerably reduced. In addition, because the use of machining is limited, the amount of material removed by machining can be significantly reduced.

These allow the outer conductors 13 of the higher-order-mode coupler 11 to be manufactured in a low-cost, material-saving manner.

Second Embodiment

Next, a method for manufacturing an outer conductor according to a second embodiment of the present invention will be described with reference to FIGS. 10 to 14.

Because this embodiment differs from the first embodiment in the steps involved in the method for manufacturing an outer conductor, the different steps are mainly described here, and a repeated description of the same steps as in the first embodiment described above is omitted.

The same members as in the first embodiment are designated by the same reference signs.

The outer conductor 13 manufactured by the method for manufacturing an outer conductor, according to this embodiment, has substantially the same structure as the outer conductor 13 manufactured in the first embodiment.

A niobium disc (metal plate) having a thickness of 3 mm and an outer diameter of 125 mm is prepared. This disc is deep-drawn into a rough shape 31 illustrated in FIG. 10 (deep drawing step). As the approximate dimensions of the rough shape 31, for example, the inner diameter is 42 mm, the outer diameter is 48 mm, the height is 70 mm, and the thickness is 3 mm, where the disc is processed such that the inner and outer diameters of the main body 15 are the dimensions of the final product.

The disc used is one having such a thickness that the finished thickness of the cylindrical portion of the main body 15 is achieved after the deep drawing. As in this embodiment, if the inner diameter of the main body 15 is 40 to 50 mm, the height thereof is 60 to 80 mm, and the finished thickness thereof is 2 to 3 mm, then the thickness of the disc is the same as the finished thickness of the main body 15.

Figure 11:
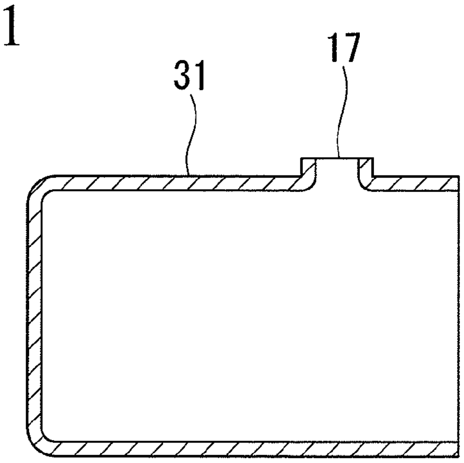
FIG. 11 is a sectional view illustrating the state after flanging in the method for manufacturing an outer conductor according to the second embodiment of the present invention.

Turning to FIG. 11, as in the first embodiment, the rough shape 31 is flanged to form the port 17 (port-forming step).

As above, because the rough shape 31 formed by deep drawing in the deep drawing step has the finished thickness of the main body 15, the next port-forming step can be initiated immediately.

Accordingly, the second machining step, which is required for dimensional adjustment in the first embodiment, can be eliminated, and particularly, the processing of the inner surface of the main body, which is difficult to process, can be completely eliminated, thus considerably reducing the number of machining steps as compared with the first embodiment and also eliminating the amount of material removed by machining.

Figure 12:
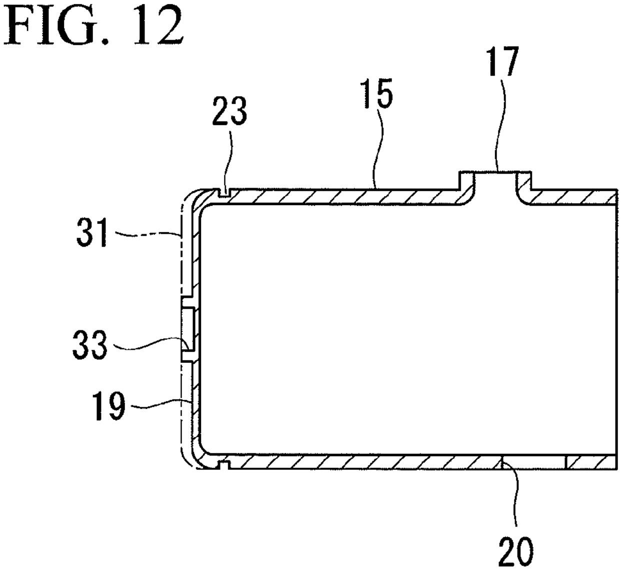
FIG. 12 is a sectional view illustrating the state after machining in the method for manufacturing an outer conductor according to the second embodiment of the present invention.

Turning to FIG. 12, the end surface 19, the mounting portion 20, a mounting portion 33 for a protruding part 35, and the groove 23 are formed on the rough shape 31 by machining (first machining step).

The end surface 19 is cut from the rough shape 31 to a thickness of 1.5 mm, which is substantially half the thickness of the rough shape 31. The mounting portion 33 is formed by cutting out a doughnut shape.

Figure 13:
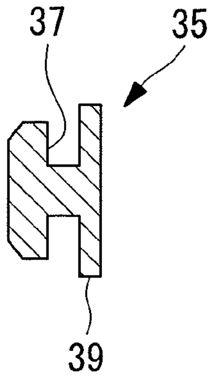
FIG. 13 is a sectional view illustrating a protruding part according to the second embodiment of the present invention.

The protruding part 35 is separately formed by machining. As illustrated in FIG. 13, the protruding part 35 has a substantially cylindrical shape divided into two portions by a groove 37, one of the portions being a fitting portion 39 to be fitted into the mounting portion 33.

Figure 14:
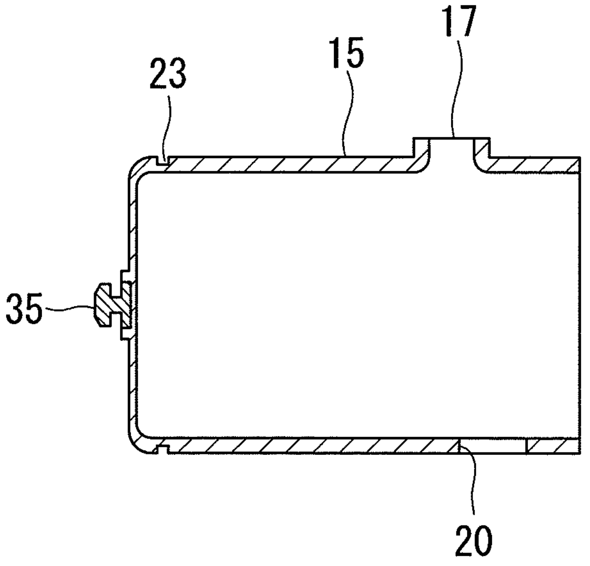
FIG. 14 is a sectional view illustrating the final assembled state in the method for manufacturing an outer conductor according to the second embodiment of the present invention.

Turning to FIG. 14, the fitting portion 39 of the protruding part 35 is fitted into the mounting portion 33 and is securely attached by welding. Electron beam welding or laser beam welding is used for the welding.

As above, because a niobium disc is deep-drawn to form the main body 15 with the finished thickness, the amount of processing of the inner surface of the main body 15, which is difficult to process, can be reduced, and the amount of material removed by machining can be significantly reduced.

These allow the outer conductor 13 of the higher-order-mode coupler 11 to be manufactured in a low-cost, material-saving manner.

The present invention is not limited to the embodiments described above; various modifications are permitted without departing from the spirit of the present invention.

The invention claimed is:

1. A method for manufacturing an outer conductor of a higher-order-mode coupler for a superconducting acceleration cavity, the outer conductor comprising:

a cylindrical main body that is open at a first end surface thereof;

a port formed in a side of the main body so as to penetrate therethrough; and a protruding part formed outside a second end surface of the main body, the method comprising:

a deep drawing step of deep-drawing a metal plate to form the main body;

a port-forming step of flanging the thus-formed main body to form the port;

a first machining step of forming a groove in a middle of the protruding part in a height direction of the protruding part by machining the main body to adjust an outer shape thereof; and a step of deforming the second end surface of the main body by pushing the protruding part or by holding and pulling the groove, and adjusting a spacing between an inner conductor disposed in the main body and the second end surface of the main body, wherein, in the first machining step, a thickness of the second end surface of the main body, except for a part where the protruding part is formed, is substantially even and is thinner than a thickness of a cylindrical portion of the main body.

2. The method for manufacturing the outer conductor according to claim 1, wherein the metal plate used to perform deep drawing in the deep drawing step is thicker than a finished thickness of a cylindrical portion of the main body, the method further comprising, before the port-forming step, a second machining step of machining the main body to the finished thickness of the cylindrical portion of the main body.

3. The method for manufacturing the outer conductor according to claim 1, wherein the metal plate used in the deep drawing step has such a thickness that a finished thickness of the cylindrical portion of the main body is achieved after the deep drawing step.

* * * * *